(12) United States Patent
Deweerd et al.

(10) Patent No.: US 8,654,560 B2
(45) Date of Patent: Feb. 18, 2014

(54) VARIABLE RESISTANCE MEMORY WITH A SELECT DEVICE

(75) Inventors: Wim Deweerd, San Jose, CA (US); Yun Wang, San Jose, CA (US); Prashant Phatak, San Jose, CA (US); Tony Chiang, Campbell, CA (US)

(73) Assignee: Intermolecular, Inc., San Jose, CA (US)

( * ) Notice: Subject to any disclaimer, the term of this patent is extended or adjusted under 35 U.S.C. 154(b) by 128 days.

(21) Appl. No.: 13/252,827

(22) Filed: Oct. 4, 2011

(65) Prior Publication Data

US 2012/0025164 A1  Feb. 2, 2012

Related U.S. Application Data

(63) Continuation-in-part of application No. 12/607,898, filed on Oct. 28, 2009, now Pat. No. 8,072,795.

(51) Int. Cl.
*G11C 11/00* (2006.01)

(52) U.S. Cl.
USPC .............. 365/148; 365/51; 365/63; 365/72; 365/163

(58) Field of Classification Search
USPC .................... 365/51, 63, 72, 148, 163
See application file for complete search history.

(56) References Cited

U.S. PATENT DOCUMENTS

| 8,072,795 B1* | 12/2011 | Wang et al. ............... 365/148 |
| 2006/0221678 A1* | 10/2006 | Bedeschi et al. ........... 365/163 |
| 2009/0180313 A1* | 7/2009 | Deweerd et al. ........... 365/163 |
| 2011/0291066 A1* | 12/2011 | Baek et al. ................ 257/4 |
| 2013/0044539 A1* | 2/2013 | Hirst et al. ................ 365/163 |
| 2013/0070511 A1* | 3/2013 | Wells et al. ............... 365/148 |

* cited by examiner

*Primary Examiner* — Fernando Hidalgo

(57) ABSTRACT

According to various embodiments, a variable resistance memory element and memory element array that uses variable resistance changes includes a select device, such as an ovonic threshold switch. The memory elements are able to switch during the very brief period when a transient pulse voltage is visible to the memory element.

13 Claims, 3 Drawing Sheets

VARIABLE RESISTANCE MEMORY WITH A SELECT DEVICE

CROSS REFERENCE TO RELATED APPLICATIONS

The present application is a continuation-in-part application of U.S. patent application Ser. No. 12/607,898 filed on Oct. 28, 2009, pending. Said U.S. patent application Ser. No. 12/607,898 is herein incorporated by reference in its entirety.

TECHNICAL FIELD

The present invention relates generally to semiconductor memories. More specifically, a variable resistance memory with a select device is described.

BACKGROUND

Non-volatile memories are semiconductor memories that retain their contents when unpowered. Non-volatile memories are used for storage in electronic devices such as digital cameras, cellular telephones, music players, as well as in general computer systems, embedded systems and other electronic devices that require persistent storage. Non-volatile memories may be in the form of removable and portable memory cards or other memory modules. Non-volatile memories may be integrated into other types of circuits or devices, or can take any other desired form. Non-volatile memories are becoming more prevalent due to their small size, persistence, lack of moving parts, and reduced power requirements.

Flash memory is a common type of non-volatile memory used in a variety of devices. Flash memory uses an architecture that is proving inadequate in its access, erase and write times for the rapidly increasing operational speed requirements of electronic devices. Flash memory is further limited by its cost per unit storage and limited in the erasure of data in blocks of data rather than single bytes like random access memory (RAM). Memory cells of flash memory have a limited lifespan, such as around 100,000 write cycles, thus making it an inappropriate alternative to RAM.

Volatile memories, such as RAM can potentially be replaced by non-volatile memories. A non-volatile memory may replace RAM if the speed of non-volatile memory is increased to meet the requirements for RAM and other applications currently using volatile memories. One type of non-volatile memory may be variable resistance memory and may provide alternative to flash memory and random access memory (RAM) in a number of applications.

Variable resistance memory includes a variable resistance material (e.g. a dielectric material such as a metal oxide) that may change from a first resistivity to a second resistivity upon the application of a set voltage, and from the second resistivity back to the first resistivity upon the application of a reset voltage. Variable resistance memories use set and reset voltages that have opposite polarities relative to a common electrical reference (a common electrical reference may include a ground). When variable resistance memory elements are incorporated into a memory array, a select device is included to facilitate the selection of a desired memory bit. With existing variable resistance memories, diodes have been employed for selection of the desired memory bit.

The use of diodes as select devices for selection of a desired memory bit in variable resistance memory array is limited by a property of the diode to only conduct current in a single direction under one bias polarity. Additionally, the use of diodes for selection of the desired memory bit requires significant space which limits the ability to reduce the size of variable resistance memories. Significant space is required for fabrication of a variable resistance memory since diodes are not stackable upon the variable resistance material during fabrication of the variable resistance memory. Thus, what is needed is a variable resistance memory including a select device which provides bidirectional switching and may be stacked with layers of the variable resistance memory array to reduce the size of variable resistance memory.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Figure 1A:
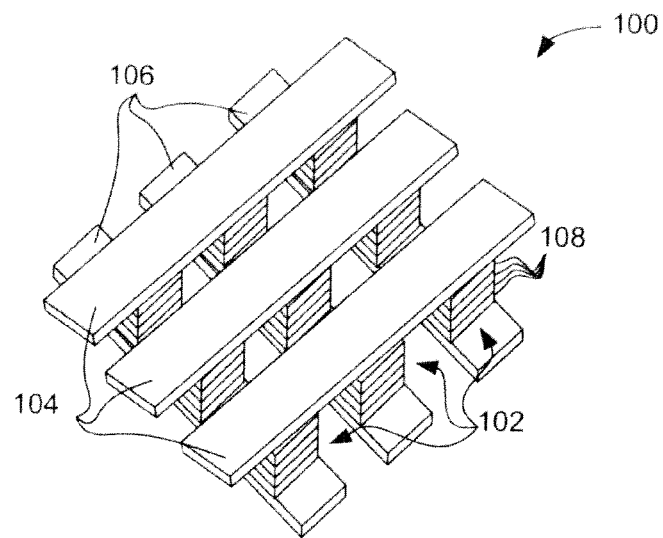
FIG. 1A illustrates a memory array of variable resistance memory elements.
Figure 1B:
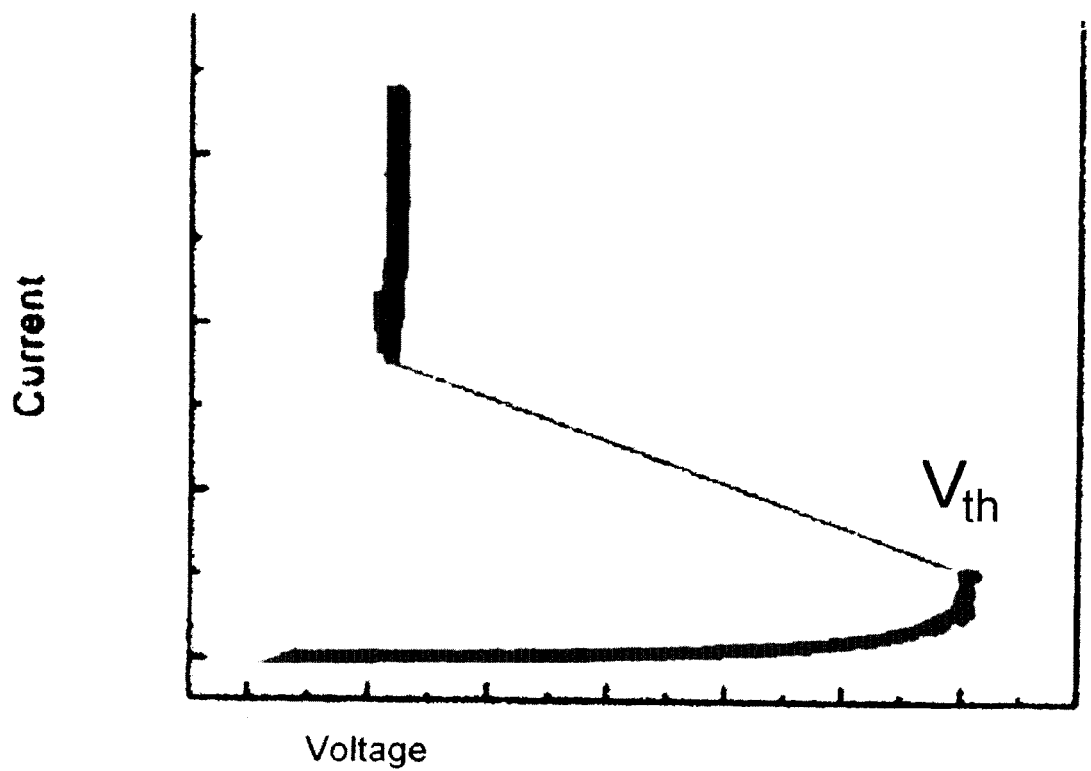
FIG. 1B illustrates current (I) versus voltage (V) plot for an ovonic threshold switch (OTS) device.

Referring to FIG. 1A, an exemplary memory array 100 is shown. Memory array 100 may use variable resistance, such as bipolar resistances, and may include a select device. Select device may be an ovonic threshold switch (OTS). OTS may be a two-terminal element. OTS may include a high resistance condition referred as an off state at a low electric field and a low resistance condition referred as an on state when a certain voltage (referred as the switching threshold voltage) is obtained. Referring to FIG. 1B, an exemplary current (I) versus voltage (V) plot for an OTS device is shown. The plot may be bipolar and symmetric in that the plot may look similar upon application of a negative voltage with the current flowing in an opposite direction. As a result, ovonic threshold switch may allow for bidirectional switching and may be easily integrated as a select device for memory array 100. OTS may have a strong non-ohmic current-voltage curve as shown. For example, at a certain voltage, such as the switching threshold voltage, the resistance of the OTS device drops significantly. As long as the voltage and current on the OTS device stays at a certain level (known as the holding voltage and holding current) the OTS will operate in a low resistance condition of the on state. The switching threshold voltage for the OTS device may fall in a range of 1-5 Volts and may be controlled by modification of properties such as the type of materials employed in the switch and an OTS film thickness to be discussed. Advantageously, the switching threshold voltage range of 1-5 Volts may be suitable for operating with memory array 100 and specifically within desired ranges for switching voltages of a variable resistance memory array to be discussed.

I. Memory Structure

A. Memory Array

Referring once again to FIG. 1A, a memory array 100 of variable resistance memory elements 102 is shown. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers of materials, as is described in further detail below. In addition, memory arrays shown can be stacked in a vertical fashion to make multi-layer three-dimensional (3-D) memory arrays.

Any suitable read/write circuitry and array layout scheme may be used to construct a non-volatile memory device from variable resistance memory elements such as element 102. For example, horizontal and vertical lines 104 and 106 may be connected directly to the terminals of variable resistance memory elements 102. This is merely illustrative. Select devices may be connected in series in any suitable location in memory element 102. As is described herein, an ovonic threshold switch may be employed as the select device and may be associated with each memory element 102. Ovonic threshold switch may be implemented in a stackable structure whereby multiple memory elements 102 and the associated ovonic threshold switch may be stacked.

B. Memory Element

1. MIM Structure

Figure 2:
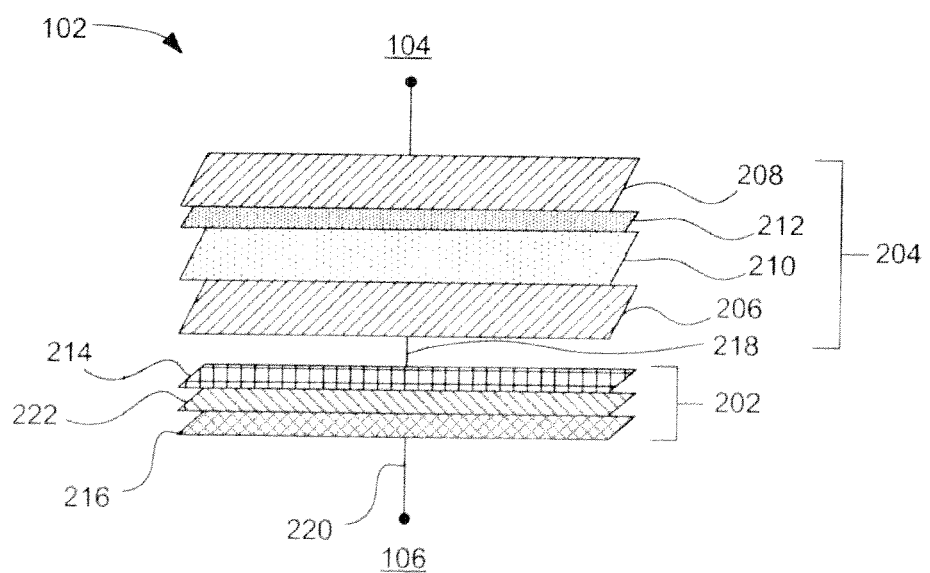
FIG. 2 illustrates a memory element including variable resistance element and a select device.

FIG. 2 illustrates a memory element 102 including a variable resistance element and a select device, such as an ovonic threshold switch (OTS) 202. Memory element 102 includes a metal-insulator-metal (MIM)-style stack 204. The stack 204 includes two electrodes: a first electrode 206 and a second electrode 208 and a variable resistance layer 210 (e.g. an insulator or metal oxide). Electrodes 206 and 208 can be metals, metal oxides, or metal nitrides (e.g. Pt, Ru, $RuO_2$, Ir, $IrO_2$, TiN, W, Ta, TaN), or can be doped silicon, for example p- or n-type doped polysilicon. The variable resistance layer 210 can be a metal oxide or other dielectric material. In some embodiments, the variable resistance layer 210 is a higher bandgap (i.e. bandgap greater than four electron volts (eVs)) material such as $HfO_2$, $Ta_2O_5$, or $Al_2O_3$, $Y_2O_3$, or $ZrO_2$.

As is explained further below, materials employed for variable resistance layer 210 use defect-based mechanisms to switch from a high resistance state to a low resistance state and vice versa. These materials further have set and reset voltages (i.e. switching voltages) that increase with increasing thickness of the variable resistance layer 210 and the defects are filled by a voltage-mediated (e.g. a field-based) mechanism. Defects can be filled (and the resistance of layer 210 can change) during a transient voltage pulse or a non-transient voltage pulse. Resistance-switching layer may switch using a transient-type switching mechanism with a relatively short (e.g. less than 1 ms, less than 10 μs, less than 5 μs, less than 1 μs, or less than 100 ns) voltage pulse (i.e. "a transient pulse voltage") and may switch with steady, non-transient voltage pulses.

Stack 204 in FIG. 2 can also include an interface layer 212, which may be another metal oxide such as $TiO_2$, $ZrO_2$, and $Al_2O_3$. The interface layer 212 can, for example, provide a diffusion barrier between the second electrode 208 and the variable resistance layer 210, and the interface layer 212 can optionally include a same most prevalent metal as the second electrode 208 (e.g. the electrode can be TiN, while the interface layer 212 is $TiO_2$). The interface layer 212 can be thinner than the variable resistance layer 210, for example the interface layer 212 can have a thickness that is less than 25% of the thickness of the variable resistance layer 210, or a thickness that is less than 10% of the thickness of the variable resistance layer 210. For example, the variable resistance layer 210 can be a 50 Å layer, or a 20-100 Å or 20-60 Å layer, and the interface layer 212 can be a 5-10 Å layer.

2. Ovonic Threshold Switch

OTS 202 may operate as a pass gate insofar that it may control a current and voltage drop on the memory stack 204 connected in series with the OTS 202 whereby a high resistance condition of the OTS is considered an off state and a low resistance condition is considered an on state. If the OTS 202 is momentarily biased across its electrodes with a voltage above its switching threshold voltage, and the voltage is maintained at or above the holding voltage, the OTS will switch from an off state into an on state and remain in the on state. When in the on state, the OTS 202 will revert to an off state when the voltage across the electrodes of the OTS 202 momentarily drops below the holding voltage and the switching process of the OTS 202 can start again without any further operation on the OTS 202.

OTS 202 may include a first film or layer 216, an ovonic threshold switch layer 222 and a second film or layer 214. Ovonic threshold switch layer 222, also known as the OTS film, may include an amorphous chalcogenide alloy that may include various amounts of two or more of the following elements: tellurium, sulfur, arsenic, germanium, antimony and selenium such as TeAsGe. OTS film 222 may be amorphous and may remain amorphous when switching between the on state and the off state, and vice versa. Films 214, 216 surrounding OTS film 222 may be a thin conductive material serving as electrodes to the OTS 202 and may be separately deposited. In FIG. 2, OTS 202 is coupled to the first electrode 206; however as OTS allows for bidirectional switching, OTS 202 may be coupled to second electrode 208 in an alternative embodiment and may only affect bias conditions, such as the value of voltage pulses to be provided to properly place an OTS in an on state and to properly switch the variable resistance layer 210 of the memory element 102 (e.g. the set voltage and reset voltage).

OTS film 222 may include a number of electrical properties, including a stable threshold voltage VTH, sub-threshold behavior (e.g. leakage and IV slope below VTH), a stable resistance once switched on, minimum voltage/current required to keep the OTS in the on state (holding voltage/holding current) and its stability of these properties with time and temperature. A switching threshold voltage or electric field required to switch an OTS film 222 located between two electrode films may depend on thickness of the OTS film and elemental composition of the OTS film 222. For example, an OTS film 222 with a thickness of 25 nm may switch at about 1-5V which may constitute an electric field of typically 1 MV/cm.

OTS 202 may be implemented in a stackable arrangement suitable for operation within a three-dimensional nonvolatile memory or multiple level-cell. Three-dimensional memory may include multiple stacked memory elements, with each memory stack 204 including a corresponding OTS 202 in series with the memory stack 204. In one embodiment, multiple levels of a memory stack 204 and a corresponding OTS 202 may be stacked in a vertical fashion, providing multiple levels of a memory element 102. Advantageously, OTS 202 may be located below the memory stack 204; however, OTS 202 may be located and stacked above memory stack 204 in an alternative embodiment.

MIM stack 204 can be a variable resistance memory element that includes the first electrode 206, a variable resistance layer (e.g. the variable resistance layer 210) above the first electrode, and second electrode 208. OTS 202 including a first film or layer 216, an ovonic threshold switch layer 222 and a second film or layer 214 may be stacked with MIM stack 204 and may allow for stacking of multiple memory cells. In one embodiment of disclosure, first electrode 206 of MIM stack 204 and layer 214 of OTS may share the electrode which may further reduce space and reduce a total height of multiple memory devices stacked together.

In some embodiments, memory element 102 may include a signal line (e.g. the signal line 104) connected to the second electrode 208, and the signal line is configured to provide switching voltages to the second electrode 208. In some embodiments, the signal line 104 is configured to provide a negative set voltage relative to a common electrical reference, such as a ground, and a positive reset voltage relative to the common electrical reference. In other embodiments, the signal line 104 is configured to provide a positive set voltage relative to a common electrical reference and a negative reset voltage relative to the common electrical reference. For example, the common electrical reference may be ground (i.e. 0V), the set voltage would then be a negative voltage (e.g. −2V), and the reset voltage would be a positive voltage (e.g. 2V). The common electrical reference can be any voltage; however, such as +2V or −2V. More generally, one switching voltage (e.g. the reset voltage) of the memory element can have a first polarity (e.g. a positive polarity) relative to the common electrical reference, and the other switching voltage (e.g. the set voltage) can have a negative polarity relative to the common electrical reference so that the memory element uses bipolar switching. Additionally, the switching voltages such as the set voltage comprise a transient pulse voltage (e.g. a square wave pulse) having a pulse length of less than 10 μs. In alternative embodiments, the switching voltages comprise a non-transient voltage. In some embodiments, the signal line 104 is a bit line, while the signal line 106 is a word line.

Node 220 may be connected to the signal line 106, which may be, for example, a bit line or word line, or connected to a bit line or word line. The nodes 218 and 220 are not necessarily present in the memory array 100, for example the first electrode 206 may be in direct contact with the top electrode layer 214 of OTS 202 in a stacked arrangement, or another physical layer may be placed between the first electrode 206 and the top electrode layer 214 of OTS 202.

3. Material Examples

Some examples of stacks 204 that can be used include a stack 204 having a titanium nitride first electrode 206, a 20-60 Å hafnium oxide variable resistance layer 210, a 5-10 Å titanium oxide interface layer 212, and an electrode with a work function greater than that of TiN, such as Ru, $RuO_2$, Molybdenum oxides, Ir, $IrO_2$, Pt, other noble or near-noble materials, etc. second electrode 208. In this example, the higher work function electrode receives a positive pulse (as measured compared to a common potential) during a reset operation. Another example of a stack 204 is one including a doped polysilicon first electrode 206, a 20-60 Å hafnium oxide variable resistance layer 210, a 5-10 Å titanium oxide interface layer 212, and a titanium nitride second electrode 208. In other embodiments, the variable resistance layer 210 can be another high bandgap material (e.g. $Ta_2O_5$, $Al_2O_3$, etc.). As described above, in some embodiments the electrodes can be materials exhibiting a work function difference (e.g. 0.1 to 1 eV, or 0.4 to 0.6 eV, etc.)

In some embodiments, the switching layer 210 can be between 20 and 100 Å thick, 20 and 60 Å thick, 10 and 200 Å thick, 40 and 60 Å thick or any appropriate thickness for a given application. The interface layer 212 can be less than 25 percent the thickness of the switching layer 210. The various layers can be deposited using any deposition technique, including physical vapor deposition (PVD), chemical vapor deposition (CVD), plasma-enhanced CVD (PECVD), atomic layer deposition (ALD), plasma-enhanced ALD (PEALD), electroless deposition (ELD), electroplating, etc. In some embodiments, multiple deposition techniques can be used, for example, the electrodes can be deposited using PVD, while the switching layer 210 and interface layer 212 are deposited using ALD.

II. Memory Operation

During a read operation, the state of a memory element 102 can be sensed by applying a sensing voltage (i.e., a "read" voltage $V_{READ}$) to an appropriate set of signal lines 104 and 106. Operation of the OTS 202 may cause the memory element to be accessed for a read or write operation only when the OTS 202 is 'on' as a select device. Thus upon the application of an appropriate voltage (e.g. the threshold voltage for the OTS and appropriate read or write voltage), OTS 202 is placed in the 'on' state and may allow a read or write operation, the write operations including both application of a set voltage or reset voltage.

Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Figure 3:
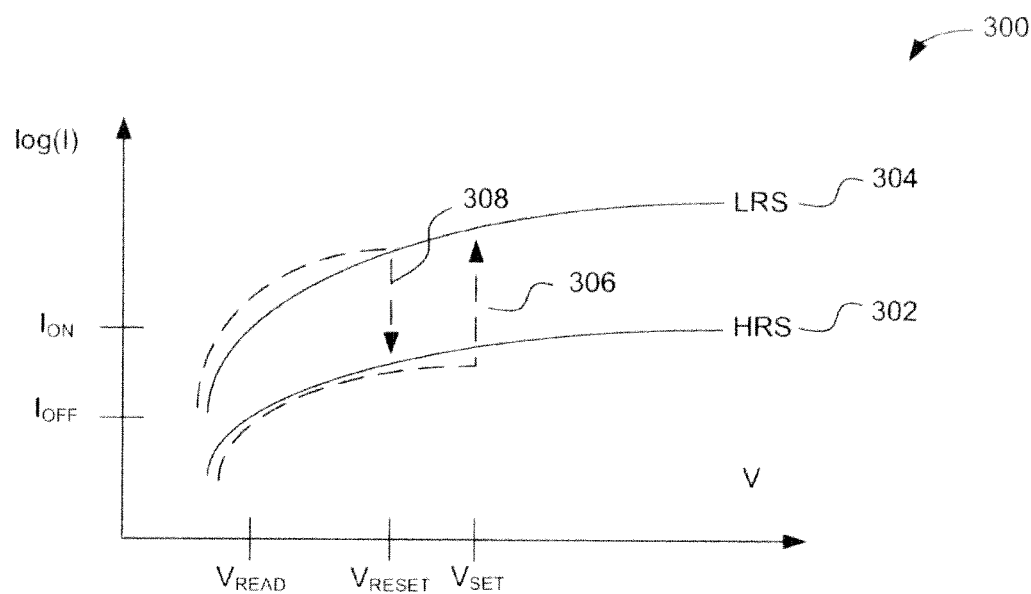
FIG. 3 is a logarithm of current (I) versus voltage (V) plot for a memory element.

FIG. 3 is a logarithm of current (I) versus voltage (V) plot 300 for a memory element 102. FIG. 3 illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 302. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 306. In this region, the memory element 102 is changed so that, following removal of the set voltage $V_{SET}$, memory element 102 is characterized by low resistance curve LRS 304. As is described further below, the change in the resistive state of memory element 102 may be because of the filling of traps (i.e., a may be "trap-mediated") in a metal oxide material. $V_{SET}$ and $V_{RESET}$ can be generally referred to as "switching voltages."

The low resistance state of memory element 102 can be sensed using read and write circuitry. When a read voltage $V_{READ}$ is applied to variable resistance memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 308. When the reset voltage $V_{RESET}$ is removed from memory element 102, memory element 102 will once again be characterized by high resistance line HRS 304. Voltage pulses can be used in the programming of the memory element 102. For example, a 1 ms, 10 µs, 500 ns, 50 ns square pulse can be used to switch the memory element 102; in some embodiments, it may be desirable to adjust the length of the pulse depending on the amount of time needed to switch the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially changes, the set and reset voltages can be used to change the resistance state of the memory element 102.

A bistable resistance of variable resistance memory element 102 makes memory element 102 suitable for storing digital data. Multiple stable resistances may also be employed for variable resistance memory. Because no changes take place in the stored data in the absence of application of the voltages $V_{SET}$ and $V_{RESET}$, memory formed from elements such as element 102 is non-volatile.

Memory element 102 may use bipolar switching voltages. In other words, at the second electrode 208, one switching voltage (e.g. $V_{RESET}$) is positive compared to a common electrical reference (e.g. a ground), while the other switching voltage (e.g. $V_{SET}$) is negative compared to the common electrical reference. As an example, the common electrical reference may be ground (0V), while $V_{RESET}$ is +2V, and $V_{SET}$ is −2V. It is contemplated that the bias of $V_{RESET}$ and $V_{SET}$ may be reversed. In an alternative embodiment, OTS may be further coupled to first electrode rather than second electrode and may only affect bias conditions.

It is contemplated that while variable resistance layer is capable of switching with a transient pulse voltage, a non-transient voltage may also be employed since OTS provides bidirectional switching. It is further contemplated that the bias conditions, the voltage amount necessary for a read or write operation, may only depend on voltage drops along the entire series connection, including the OTS 202, memory element 102 and any other inter-positioned resistive devices or signal line resistance.

III. Variable Resistance Change

Without being bound by theory, the memory element 102 uses a variable resistance change, also known as a switching mechanism that is mediated in the bulk of a layer of the metal oxide. In one embodiment, the switching mechanism uses non-metallic conductive paths rather than filamentary or metallic conductive paths. Generally, defects are formed in, already exist in the deposited metal oxide, and existing defects can be enhanced. Defects may take the form of variances in charge in the structure of the metal oxide. For example, some charge carriers may be absent from the structure (i.e., vacancies), additional charge carriers may be present (i.e., interstitials), or one species may substitute for another (e.g. Ti into Hf, a substitutional). Therefore, by applying a voltage to the memory element 102, the defects, such as traps, can either be filled or emptied to alter the resistivity of a metal oxide and variable resistance memory elements can be formed using these principles.

It is believed that the memory elements described herein may switch according to a non-transient switching mechanism or a transient-type switching mechanism that switches using a short transient voltage pulse (e.g. less than 1 ms, less than 10 µs, less than 500 ns, less than 50 ns, etc.). The transient-type switching mechanism may use a voltage-dependent mechanism, current-dependent mechanism, power-dependent mechanism, or some combination of these mechanisms. Using bipolar switching voltages, one switching voltage (e.g. the set voltage) will use a current that flows in the opposite direction as current flow for the other switching voltage (e.g. the reset voltage). Because the memory element is able to switch so quickly using the transient voltage pulse, the memory element sees the transient voltage pulse and is able to switch.

It can be shown that the set voltage is dependent on the thickness of the metal oxide which may indicate a bulk-mediated mechanism and voltage-dependent (e.g. electric field-based) switching characteristics. As is discussed above, the memory element 102 may be one that has voltage-dependent (e.g. electric field-based) switching characteristics, which indicates that the application of switching voltages fills and empties the traps of the variable resistance layer 210, allowing the memory element 102 to switch. However, in other embodiments, the memory element 102 may exhibit current-dependent switching characteristics, power-dependent switching characteristics, or some combination.

The metal oxides have any phase (e.g., crystalline and amorphous) or mixtures of multiple phases. The deposited metal oxides can have dopants (i.e., substitutional defects) such as an aluminum atom where a hafnium atom should be, vacancies (missing atoms), and interstitials (extra atoms). Amorphous-phase metal oxides may have increased resistivity, which in some embodiments can lower the operational currents of the device to reduce potential damage to the memory element 102.

Figure 4:
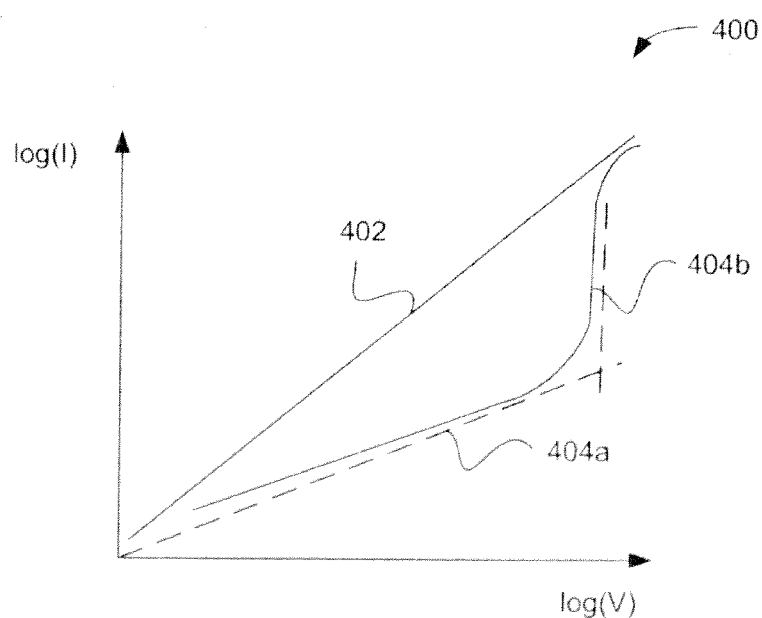
FIG. 4 is a current (I) versus voltage (V) plot for a memory element that demonstrates a resistance state change.

FIG. 4 is a current (I) versus voltage (V) plot 400 for a memory element 102 that demonstrates a resistance state change. The plot 400 shows a voltage ramp applied to the memory element 102 along the x-axis and the resulting current along a y-axis. The line 402 represents the response of an ohmic material when the ramped voltage is applied. An ohmic response is undesirable, since there is no discrete voltage at which the set or reset occurs.

Generally, a more abrupt response like graph 404 is desired. The graph 404 begins with an ohmic response 404*a*, and then curves sharply upward 404*b*. The graph 404 may represent a set operation, where the memory element 102 switches from the HRS 302 to the LRS 304.

Without being bound by theory, non-metallic percolation paths are formed during a set operation and broken during a reset operation. For example, during a set operation, the memory element 102 switches to a low resistance state. The percolation paths that are formed by filling traps (which would otherwise impede carrier flow) increase the conductivity of the metal oxide, thereby reducing (i.e., changing) the resistivity. The voltage represented by 404b is the set voltage. At the set voltage, the traps are filled and there is a large jump in current as the resistivity of the metal oxide decreases. The application of a reset voltage empties the filled traps.

As previously described, resistive random access memory (RRAM) may include a dielectric layer, such as a metal oxide disposed between two electrodes. Select device, such as OTS device, used in RRAM may be employed and utilized with a variety of types of RRAM. For example, RRAM may include a metal-insulator-metal oxygen defect model. RRAM may also include a filament-based mechanism wherein a RRAM cell may conduct by forming a distinct filament in a limited area of the dielectric layer. Categories of RRAM operable with the OTS select device as described in the present application may include conductive-bridging RAM (CBRAM), programmable metallization cells (PMC), phase-change memory (PCM) and memristors. It is further contemplated that any type or form of RRAM may be employed with the OTS select device for selection of a memory cell of the RRAM without departing from the scope or intent of the present application.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A memory array comprising:
   a variable resistance memory element including:
      a first electrode;
      a second electrode; and
      a variable resistance layer disposed between the first electrode and the second electrode;
   an ovonic threshold switch coupled with the first electrode of the variable resistance memory element,
      wherein the ovonic threshold switch comprises an ovonic threshold switch layer formed from TeAsGe; and
   a signal line connected to the second electrode of the variable resistance memory element,
      the signal line is configured to provide a positive set voltage relative to a common electrical reference for the variable resistance memory element and a negative reset voltage relative to the common electrical reference for the variable resistance memory element,
   wherein the first electrode comprises titanium nitride,
   wherein the variable resistance layer comprises hafnium oxide, and
   wherein the second electrode has a work function greater than the first electrode.

2. The memory array of claim 1, wherein the ovonic threshold switch layer is amorphous.

3. The memory array of claim 1, wherein the ovonic threshold switch has a switching threshold voltage of about 1-5 volts.

4. The memory array of claim 1, wherein the ovonic threshold switch is connected to a word line of the memory array.

5. The memory array of claim 4, wherein the second electrode is connected to a bit line of the memory array.

6. The memory array of claim 1, wherein the ovonic threshold switch is stacked with said variable resistance memory element.

7. The memory array of claim 1, wherein the ovonic threshold switch layer remaining amorphous during switching of the ovonic threshold switch.

8. The memory array of claim 1, wherein the variable resistance layer comprises one of hafnium oxide, tantalum oxide, aluminum oxide, yttrium oxide, or zirconium oxide.

9. The memory array of claim 1, further comprising an interface layer disposed between the second electrode and the variable resistance layer.

10. The memory array of claim 9, wherein the interface layer comprises one of titanium oxide, zirconium oxide, or aluminum oxides.

11. The memory array of claim 9, wherein the interface layer comprises titanium oxide, and wherein the second electrode comprises titanium nitride.

12. The memory array of claim 9, wherein a thickness the interface layer is less than 25% of a thickness of the variable resistance layer.

13. The memory array of claim 9, wherein a thickness the interface layer is between about 5 Angstroms and 10 Angstroms, and wherein a thickness of the variable resistance layer is between about 20 Angstroms and 100 Angstroms.

* * * * *